United States Patent
An et al.

(10) Patent No.: US 11,626,882 B1
(45) Date of Patent: Apr. 11, 2023

(54) DUAL-STRUCTURE ACQUISITION CIRCUIT FOR FREQUENCY SYNTHESIS

(71) Applicant: VIAVI SOLUTIONS INC., San Jose, CA (US)

(72) Inventors: Byung-Kuk An, Seoul (KR); Young-Joung Hong, Seoul (KR); Hyoung-Kyoun Park, Seoul (KR)

(73) Assignee: VIAVI SOLUTIONS INC., Chandler, AZ (US)

( * ) Notice: Subject to any disclaimer, the term of this patent is extended or adjusted under 35 U.S.C. 154(b) by 0 days.

(21) Appl. No.: 17/750,792

(22) Filed: May 23, 2022

(51) Int. Cl.
*H03L 7/187* (2006.01)
*H03L 7/099* (2006.01)
*H03L 7/089* (2006.01)
*H03L 7/093* (2006.01)

(52) U.S. Cl.
CPC ............ *H03L 7/187* (2013.01); *H03L 7/0891* (2013.01); *H03L 7/093* (2013.01); *H03L 7/099* (2013.01); *H03L 2207/12* (2013.01)

(58) Field of Classification Search
CPC ....... H03L 7/187; H03L 7/0891; H03L 7/093; H03L 7/099; H03L 2207/12
See application file for complete search history.

(56) References Cited

U.S. PATENT DOCUMENTS

| 8,704,562 | B2 | 4/2014 | Nicholls et al. | |
|---|---|---|---|---|
| 9,793,904 | B1* | 10/2017 | Chenakin | H03L 7/087 |
| 10,908,635 | B1* | 2/2021 | Ranganathan | H03L 7/22 |
| 11,245,406 | B2* | 2/2022 | Ranganathan | H03L 7/23 |
| 2015/0145567 | A1* | 5/2015 | Perrott | H03M 1/0854 327/156 |
| 2022/0191001 | A1* | 6/2022 | Poulsen | H03L 7/087 |

FOREIGN PATENT DOCUMENTS

WO  WO-2022199852 A1 * 9/2022

\* cited by examiner

*Primary Examiner* — Adam D Houston
(74) *Attorney, Agent, or Firm* — Mannava & Kang, P.C.

(57) ABSTRACT

A wide band frequency synthesizer may include a primary phase-locked loop (PLL) to receive a signal that include a local signal and a VCO signal mixed together and to generate the tuning voltage based on a phase comparison of the local signal and the VCO signal. The local signal may be obtained from a reference signal through frequency multiplication. If the primary PLL fails to lock onto an output frequency, a secondary PLL (acquisition circuit) may be switched in performing a phase comparison between the reference signal and the VCO signal to generate the tuning voltage. The secondary PLL may then provide the tuning voltage to an output of the primary PLL.

20 Claims, 9 Drawing Sheets

DUAL-STRUCTURE ACQUISITION CIRCUIT FOR FREQUENCY SYNTHESIS

TECHNICAL FIELD

This patent application is directed to an acquisition circuit, and more specifically, a dual-structure acquisition circuit for wide band frequency synthesizers.

BACKGROUND

A frequency synthesizer allows generation of a variety of output frequencies as multiples of a single reference frequency. A common application for a frequency synthesizer is in generating local oscillator (LO) signals for the up and down conversion of radio frequency (RF) signals. In an up-convert mode, the frequency synthesizer converts a lower frequency to a higher frequency, and it converts a higher frequency to a lower one in a down-convert mode. Frequency synthesizers are typically used in a receiver front-end or in a transmitter signal path to generate the RF signal for subsequent amplification.

Some of the common implementations of frequency synthesizers such as radio receivers, televisions, mobile telephones, radiotelephones, spectrum analyzers, cable television converter boxes, satellite receivers, and GPS systems, may involve processing of a wide band of RF signals. Thus, wide band frequency synthesizers may be used in such implementations. Wide band frequency synthesizers may have a number of challenges including, but not limited to, noise levels, engineering and financial cost of implementing circuitry (e.g., several filter banks, narrow voltage-controlled oscillators (VCOs), etc.), and/or stable frequency locking over various operating temperature ranges.

BRIEF DESCRIPTION OF DRAWINGS

Features of the present disclosure are illustrated by way of example and not limited in the following Figure(s), in which like numerals indicate like elements, in which.

DETAILED DESCRIPTION

Figure 1:
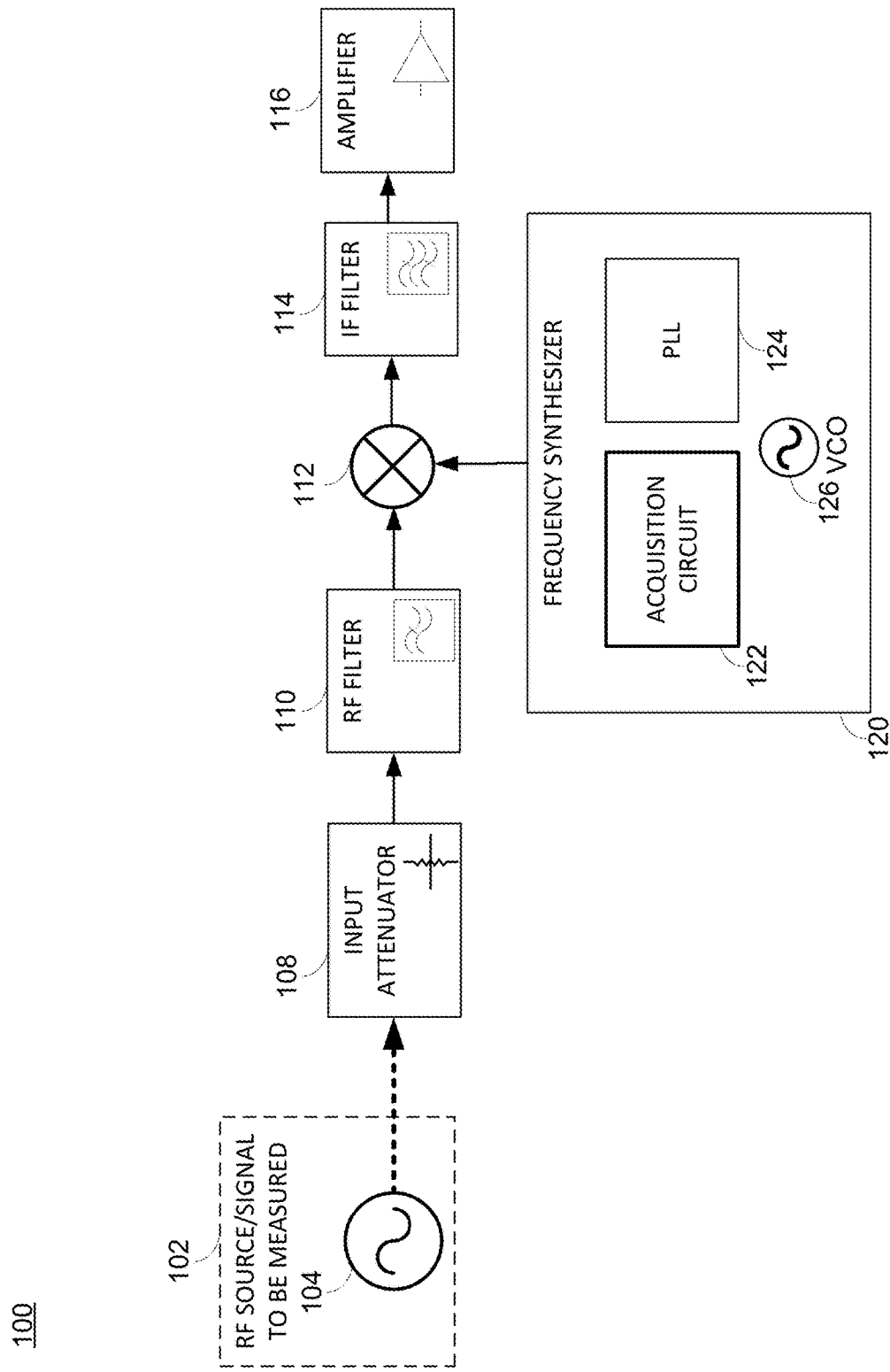
FIG. 1 illustrates a block diagram 100 of an RF system front end that includes a frequency synthesizer with an acquisition circuit, according to an example.

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

As mentioned herein, a frequency synthesizer is used to generate a variety of output frequencies as multiples of a single reference frequency in applications such as up and down conversion of RF signals. Main types of frequency synthesizers may include direct analog synthesizers (DASs), direct digital synthesizers (DDSs), and phase locked loop (PLL) based synthesizers including integer-N and fractional-N PLLs. Wide band frequency synthesizers, which may be used in wide band applications such as spectrum analyzers and similar high frequency test, monitoring, and generation systems may have challenges such as noise levels, complex (and large numbers of) circuitry (e.g., several filter banks, narrow voltage-controlled oscillators (VCOs), etc.), and/or stable frequency locking over various operating temperature ranges.

In some examples of the present disclosure, an acquisition circuit may be utilized in a wide band dual-structure frequency synthesizer. A wide band frequency synthesizer may operate with frequencies in high RF range, for example, multiple GHz compared to narrow band devices, which may be limited to frequency ranges from a few kHz to a few MHz. In the examples discussed herein, a wide band frequency synthesizer may operate in an octave band, for example, between 1 GHz and 2 GHz, The acquisition circuit may include a secondary PLL circuit in addition to a primary PLL circuit of the frequency synthesizer. The primary PLL may lock onto an output frequency in the frequency synthesizer. If the output frequency is out of range, the secondary PLL circuit may be switched to lock onto the correct output frequency. To accomplish the secondary PLL switching, a reference signal and a VCO signal in a sub-loop filter may be phase-compared using the secondary PLL for fast locking without correlation with a phase noise performance. A tuning voltage value generated when comparing the phase may be transferred to a main loop filter. A processor may monitor an output of the primary PLL and switch on the secondary PLL if it determines the primary PLL cannot lock onto the output frequency.

Some advantages and benefits of the systems and methods described herein are readily apparent. For example, the systems and methods using one or more of the configurations described herein may allow for a wide band synthesizer with low phase noise. By using a multiplied version of the input frequency for comparison with the VCO frequency at the primary PLL, a divide ratio of the frequency divider in the primary PLL may be substantially reduced (e.g., from 100 to 2). The lower divide ratio may result in substantially lower phase noise. Moreover, circuitry for implementing the acquisition circuit and the frequency synthesizer may be small-size and cost-effective because filter banks and additional VCOs may be avoided. The tuning voltage (generated when comparing the phase) for the VCO may be substantially stable over the operating temperature range. Furthermore, through the use of the acquisition circuit, the frequency synthesizer may be designed as a fast-sweep synthesizer while having a low phase noise. Other benefits and advantages may also be apparent.

FIG. 1 illustrates a block diagram 100 of an RF system front end that includes a frequency synthesizer 120 with an acquisition circuit 122, according to an example. As shown in the block diagram 100, the RF system front end includes an input attenuator 108, an RF filter 110, a mixer 112, a frequency synthesizer 120, an intermediate frequency (IF) filter 114, and an amplifier 116. In an operation, the input attenuator 108 may receive an RF signal 104 to be measured from an RF source 102. The RF signal 104 may be attenuated at the input attenuator 108 and then filtered at the RF filter 110. The filtered RF signal may then be down-converted at the mixer 112 by mixing with a signal from the frequency synthesizer 120. The resulting IF signal may be filtered at the IF filter 114 and amplified at the amplifier 116 for further processing by a measurement device, a monitoring device, a communication device, and the like.

In some examples, the frequency synthesizer 120 may include a phase-locked loop (PLL) 124, a VCO 126, and an acquisition circuit 122. The RF signal 104 may have a frequency range from about 9 kHz to about 40 GHz. The received RF signal 104 may be down-converted to the IF for ease of processing, circuit implementation, and accuracy in processing the down-converted signal. IF is a frequency to which a carrier wave (RF input signal) is shifted as an intermediate step in transmission or reception. The IF signal may be created by mixing the carrier signal (RF input signal) with a local oscillator signal in a process called heterodyning, resulting in a signal at the difference or beat frequency. The frequency synthesizer 120 may be implemented as the local oscillator providing signals to cover the wide frequency range of the RF input signal.

Accordingly, the frequency synthesizer 120 may be desired to have an accurate and stable frequency output. As oscillators (e.g., VCO 126) may be susceptible to frequency shifts and/or temperature changes, the frequency synthesizer 120 may also include the PLL 124 to lock onto an output frequency and provide a stable frequency for mixing with the RF signal 104. The acquisition circuit may include a secondary PLL circuit in addition to the primary PLL circuit of the frequency synthesizer 120. If the primary PLL (PLL 124) fails to lock onto the output frequency, the secondary PLL circuit may be switched to lock onto the correct output frequency.

Figure 2A:
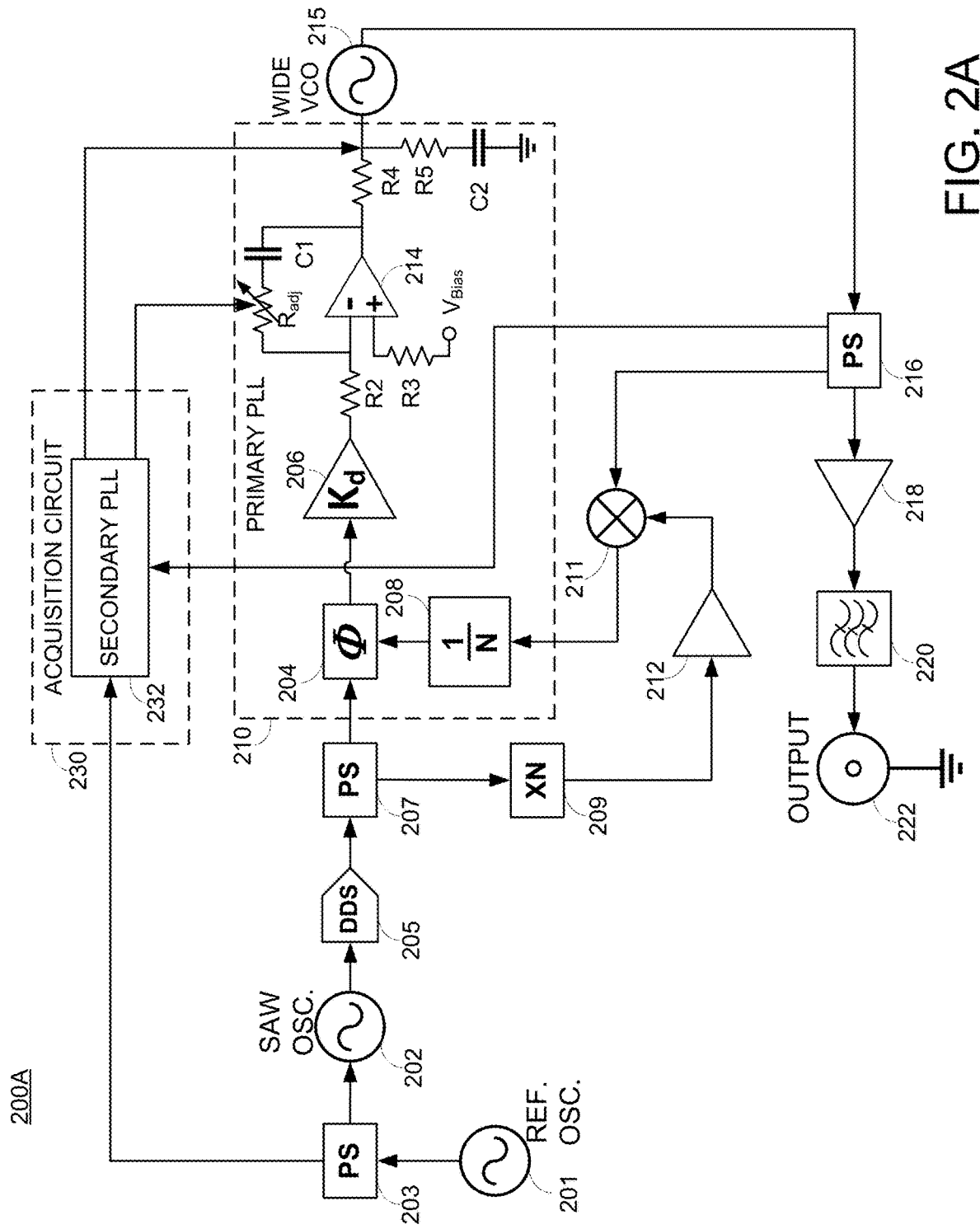
FIGS. 2A-2B illustrate schematic diagram 200A of a dual-structure frequency synthesizer including an acquisition circuit and a schematic diagram 200B of the acquisition circuit, according to examples.
Figure 2B:
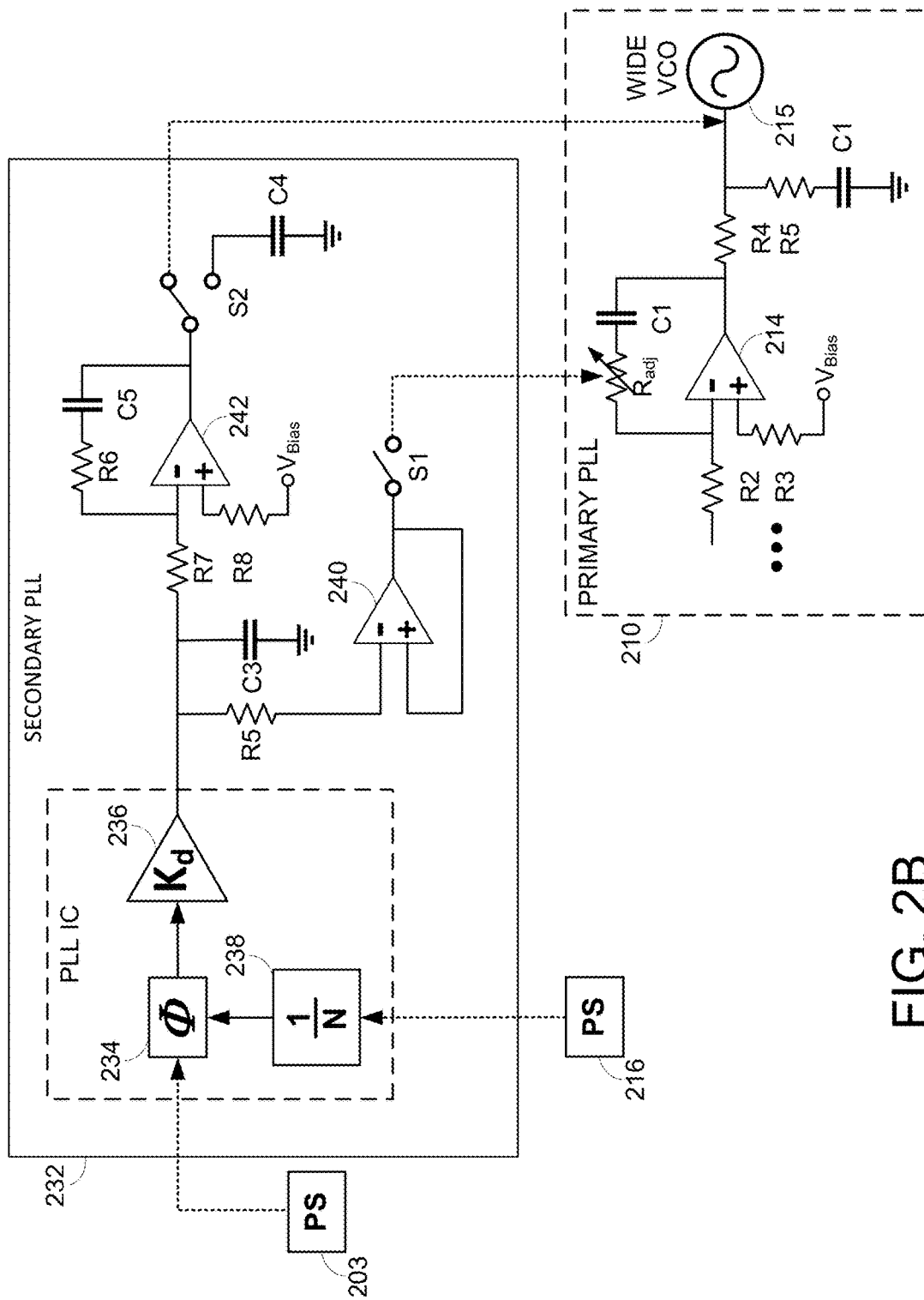

FIGS. 2A-2B illustrate schematic diagram 200A of a dual-structure frequency synthesizer including an acquisition circuit and a schematic diagram 200B of the acquisition circuit, according to an example. The frequency synthesizer shown in FIG. 2A may be used as the frequency synthesizer 120 shown in FIG. 1, and the acquisition circuit shown in FIG. 2B may be uses as the acquisition circuit 122 shown in FIG. 1. Diagram 200A shows a frequency synthesizer, where an output of the reference oscillator 201 (reference signal) is provided to a power splitter (PS) 203, then to a saw oscillator 202, a direct digital synthesizer (DDS) 205, and PS 207. An output of the PS 207 may be provided to a phase detector 204 of a primary PLL 210, which may also include the charge pump 206, the frequency divider 208, and a loop filter. At the output of the loop filter, a VCO 215, a PS 216, an amplifier 218, a bandpass filter 220, and an output 222 may form an output path of the frequency synthesizer.

Another output of the PS 207 may be provided to a multiplier 209, then to the amplifier 212, and to the mixer 211. The mixer 211 may also receive an output of the PS 216 and provide its output to the frequency divider 208. The loop filter is shown in diagram 200A with its detailed circuits, inverting amplifier 214, input resistors R2, R3, and adjustable resistor Radj and capacitor C1. At the output of the inverting amplifier 214, a filter comprising R4, R5, and C2 are provided before an input of the VCO 215, which may be a wide band VCO because an acquisition circuit 230 is used in the frequency synthesizer. The acquisition circuit 230 may be implemented as a secondary PLL 232 and receive as input an output of PS 203 (reference signal) and an output of the VCO 215 (VCO signal) according to some examples.

The reference oscillator 201 may be a stable signal source such as a temperature compensated crystal oscillator (TCXO), an ovenized crystal oscillator (OCXO), Rubidium oscillator, or similar ones. The primary PLL 210 may follow changes that occur in the VCO signal. The phase detector 204 may be used for detection and correction of errors in the VCO signal, while the charge pump 206 may convert the phase or frequency difference information into a voltage. The frequency divider 208 may divide its input frequency in a feedback loop for comparison with the frequency of the reference signal. The loop filter may be a low-pass filter and used to force the VCO 215 (which may be used as VCO 126 of FIG. 1) to replicate and track the frequency and phase at the input when in lock.

In some examples, the VCO 215 may be an electronic oscillator whose oscillation frequency is controlled by a voltage input. The applied input voltage (also referred to as tuning voltage, Vt) may determine the instantaneous oscillation frequency. In a frequency synthesizer, the VCO 215 may be used to generate a waveform whose pitch can be adjusted by the input signal. VCOs may be narrow band or wide band. A narrow band VCO may not be as sensitive to the tuning voltage compared to a wide band VCO. In a practical example, a wide band VCO for a frequency synthesizer with a frequency range of 6 GHz to 12 GHz may have a tuning sensitivity of 300-900 MHzN.

It should be appreciated that frequency synthesizers that utilize a high divide ratio (e.g., N=100) in the frequency divider, that is, divide the RF input signal frequency to obtain a frequency close to the intermediate frequency may have a high phase noise level. Thus, some frequency synthesizer designs may implement multiplication of the input signal frequency and mixing with VCO signal such that a signal provided to the frequency divider has a frequency close to the IF (e.g., N=2) and thereby a substantially lower phase noise level. However, use of multiplied signals may result in instability in the PLL and necessitate use of filter banks and/or narrow band VCOs to mitigate. In some examples, the acquisition circuit 230 implemented using the secondary PLL 232 may provide the stability mitigation by locking onto the output frequency when the primary PLL (PLL 210) fails to lock onto the output frequency.

Accordingly, the DDS 205 may generate a first signal with a frequency which is a first multiple of the input frequency, and the first signal may be provided to the phase detector 204 of the primary PLL 210. The multiplier 209 may multiply the first signal's frequency to obtain a local signal making the local signal's frequency a second multiple of the input frequency. By using the multiple of the input frequency at the frequency divider 208, a divide ratio of the frequency divider may be reduced substantially, thereby reducing the phase noise when the primary PLL is active.

The secondary PLL 232 may receive an input from PS 203 (reference signal) and another input from PS 216 (VCO signal). The acquisition circuit 230 may provide an output to control adjustable resistor Radj and another output to the VCO 215 (tuning voltage). The primary PLL may lock onto the output frequency based on a feedback input from the local frequency and, thus, have a low phase noise. If the primary PLL is out of range (fails to lock), the secondary PLL 232 may be activated and lock onto the output frequency based on a phase comparison between the input frequency (frequency of the reference signal) and VCO frequency. The combination of the primary PLL and the secondary PLL acquisition circuit may provide low phase noise, fast tracking, wide band frequency synthesis.

Diagram 200B shows details of the secondary PLL 232 with phase detector 234, charge pump 236, and frequency divider 238 (collectively referred to as PLL IC), where the phase detector 234 receives an input from the PS 203 (reference signal with input frequency) of the frequency synthesizer and the frequency divider 238 receives an input from the PS 216 (VCO signal with VCO frequency) of the frequency synthesizer. A sub-loop filter part of the secondary PLL 232 may include a buffer 240 receiving an output of the charge pump 236 through a resistor R5 and providing to a switch S1, an inverting amplifier 242 with resistors R7, R8, R6, and capacitors C3, C5 also receiving an output from the charge pump 236 and providing to switch S2. If switches S1 and S2 are in the secondary PLL activation position, the secondary PLL 232 may set a value of the adjustable resistor Radj of the primary PLL 210 and provide its output (tuning voltage Vt) to the VCO 215. The switches S1 and S2 may be controlled by a processor implemented as a field programmable gate array (FPGA) or similar circuits, for example.

Figure 3:
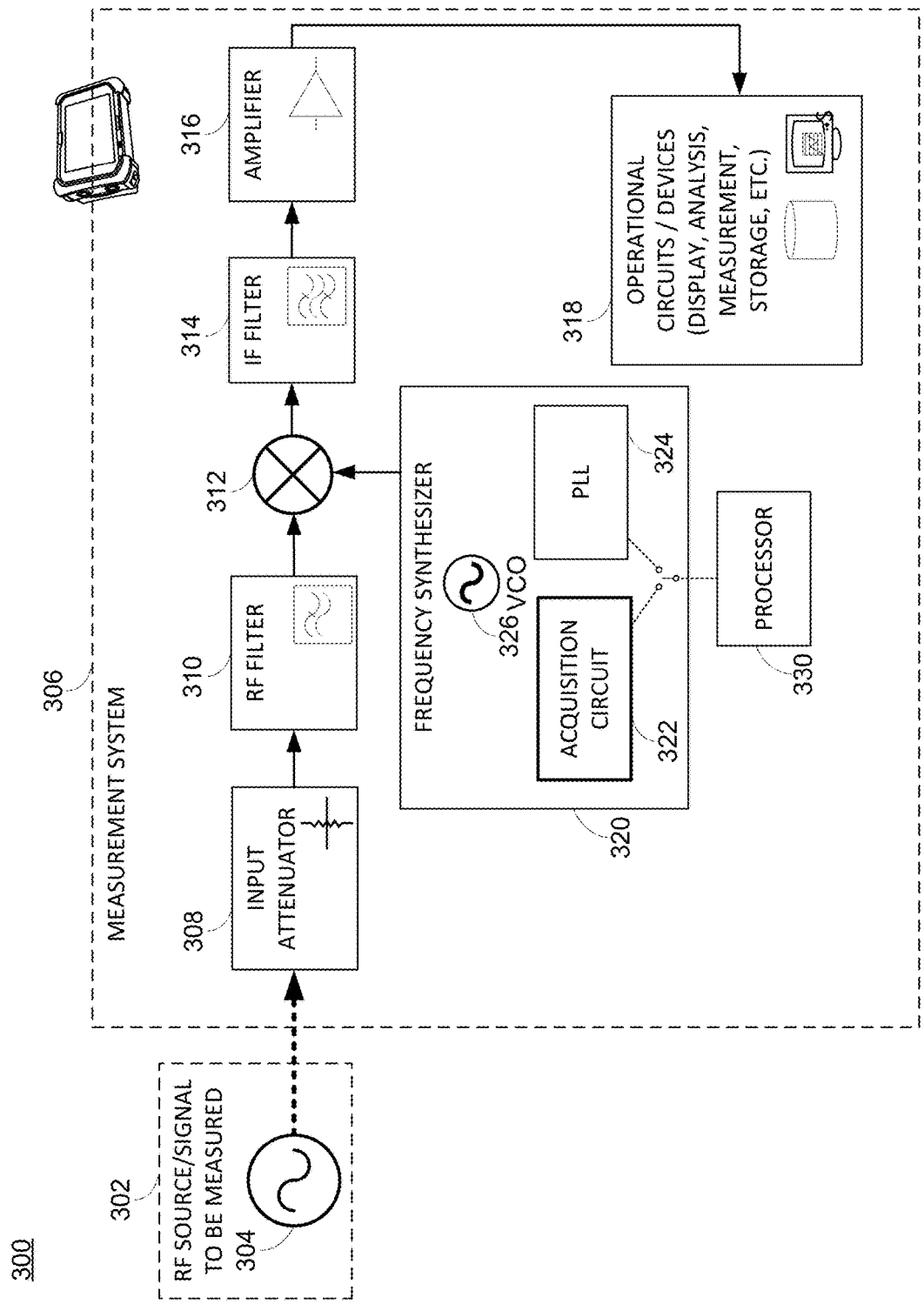
FIG. 3 illustrates diagram 300 of a measurement system with a dual-structure frequency synthesizer including an acquisition circuit, according to an example.

FIG. 3 illustrates diagram 300 of a measurement system 306 with a dual-structure frequency synthesizer including an acquisition circuit, according to an example. Measurement system 306 may include an input attenuator 308, an RF filter 310, a mixer 312, a frequency synthesizer 320, an intermediate frequency (IF) filter 314, an amplifier 316, and operational circuits or devices 318. The frequency synthesizer 320 and its components may be used for similar components shown in FIGS. 1 and 2A-B. The frequency synthesizer 320 may include a VCO 326, a PLL 324, and an acquisition circuit 322, among other circuits and subsystems. In an operation, the input attenuator 308 may receive an RF signal 304 to be measured from an RF source 302. The RF signal 304 may be attenuated at the input attenuator 308 and then filtered at the RF filter 310. The filtered RF signal may then be down-converted at the mixer 312 by mixing with a signal from the frequency synthesizer 320. The resulting IF signal may be filtered at the IF filter 314 and amplified at the amplifier 316 for further processing by the operational circuits or devices 318.

In some examples, if the PLL 324 fails to lock onto a desired output frequency, a secondary PLL of the acquisition circuit 322 may be switched on to ensure locking. The switching may be controlled by a processor 330 of the measurement system 306, which may be implemented as an FPGA or other comparable circuits. The operational circuits or devices 318 may display, analyze, measure, store, and perform comparable operations on the signal received from the amplifier 316. In some examples, the signal provided by the amplifier 316 may be converted to a digital signal. Thus, at least a portion of the operational circuits or devices 318 may be digital circuits or devices.

It should be appreciated that FIG. 3 shows a simplified block diagram of major components of the measurement system 306. A measurement or similar system may be implemented with additional of fewer components, where certain functionality may be distributed among various components and sub-systems or performed by additional components or sub-systems.

Furthermore, the measurement system 306 may be any RF measurement system/device including, but not limited to, a spectrum analyzer, a cellular system monitoring device, an RF power analyzer, etc. Example dual-structure frequency synthesizers with an acquisition circuit described herein may also be implemented in other systems and devices such as radio receivers, televisions, mobile telephones, radiotelephones, cable television converter boxes, satellite receivers, and GPS systems using the principles described herein.

Figure 4:
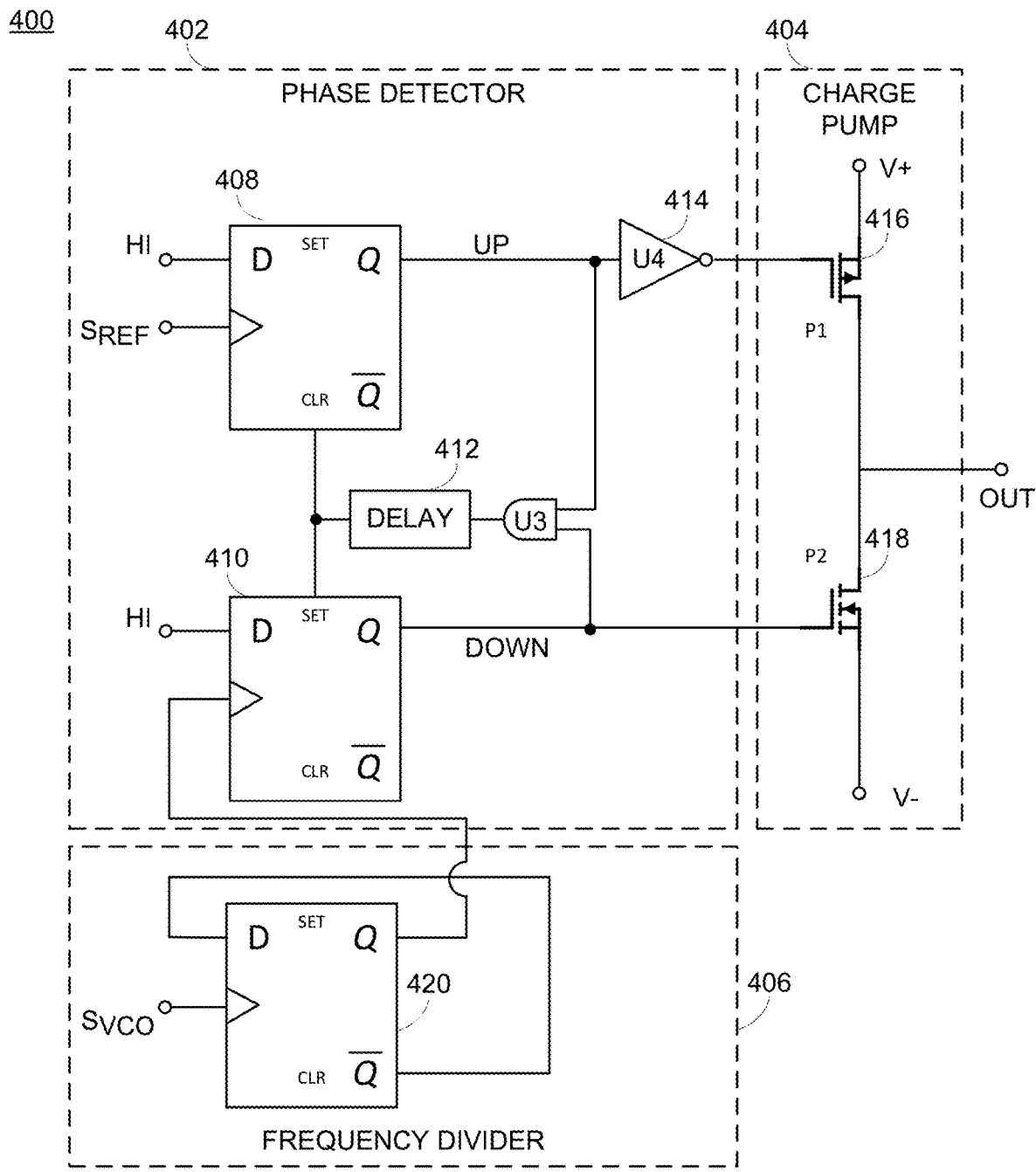
FIG. 4 illustrates a schematic diagram 400 of an implementation of a phase-locked loop (PLL) portion of a frequency synthesizer, according to an example.

FIG. 4 illustrates a schematic diagram 400 of an implementation of a phase-locked loop (PLL) portion of a frequency synthesizer, such as any of the frequency synthesizers discussed above, according to an example. As shown in schematic diagram 400, a phase detector 402 may be implemented using two D flip-flops 408, 410 and an inverter 414. A feedback loop from an output of the D flip-flop 408 using a comparator U3 and delay element 412 may control a clear input of D flip-flop 408 and a set input of the D flip-flop 410. An output of D flip-flop 410 may provide the "down" signal, while an output of the inverter 414 may provide the "up" signal. The "up" and "down" signals may be provided, respectively, to gates of serially coupled field effect transistors (FETs) 416 and 418, which may form the charge pump 404 acting as positive and negative current sources. An output of the charge pump 404 may be provided between the FETs 416, 418.

The frequency divider 406 may be implemented by one or more D flip-flops such as D flip-flop 420. An inverted output of the D flip-flop 420 may be coupled directly to a data input providing a closed loop feedback, where successive clock pulses may make a bistable toggle once every two clock cycles. The clock input of the D flip-flop 420 may be the VCO signal and the frequency divided output signal may be provided to the phase detector 402. The phase detector 402 may compare a frequency of the input signal ($S_{REF}$) at +IN input of the D flip-flop 408 and a frequency of the frequency divided VCO signal at −IN input of the D flip-flop 410. Q output of D flip-flop 408 may enable a positive current source (FET 416), and the Q output of D flip-flop 410 may enable a negative current source (FET 418). These current sources are known as the charge pump.

It should be appreciated that the phase detector 402, the charge pump 404, and the frequency divider 406 may be implemented with various configurations using fewer or additional circuit elements implementing the principles described herein. The configurations shown in diagram 400 are intended as illustrative implementation examples.

Figure 5:
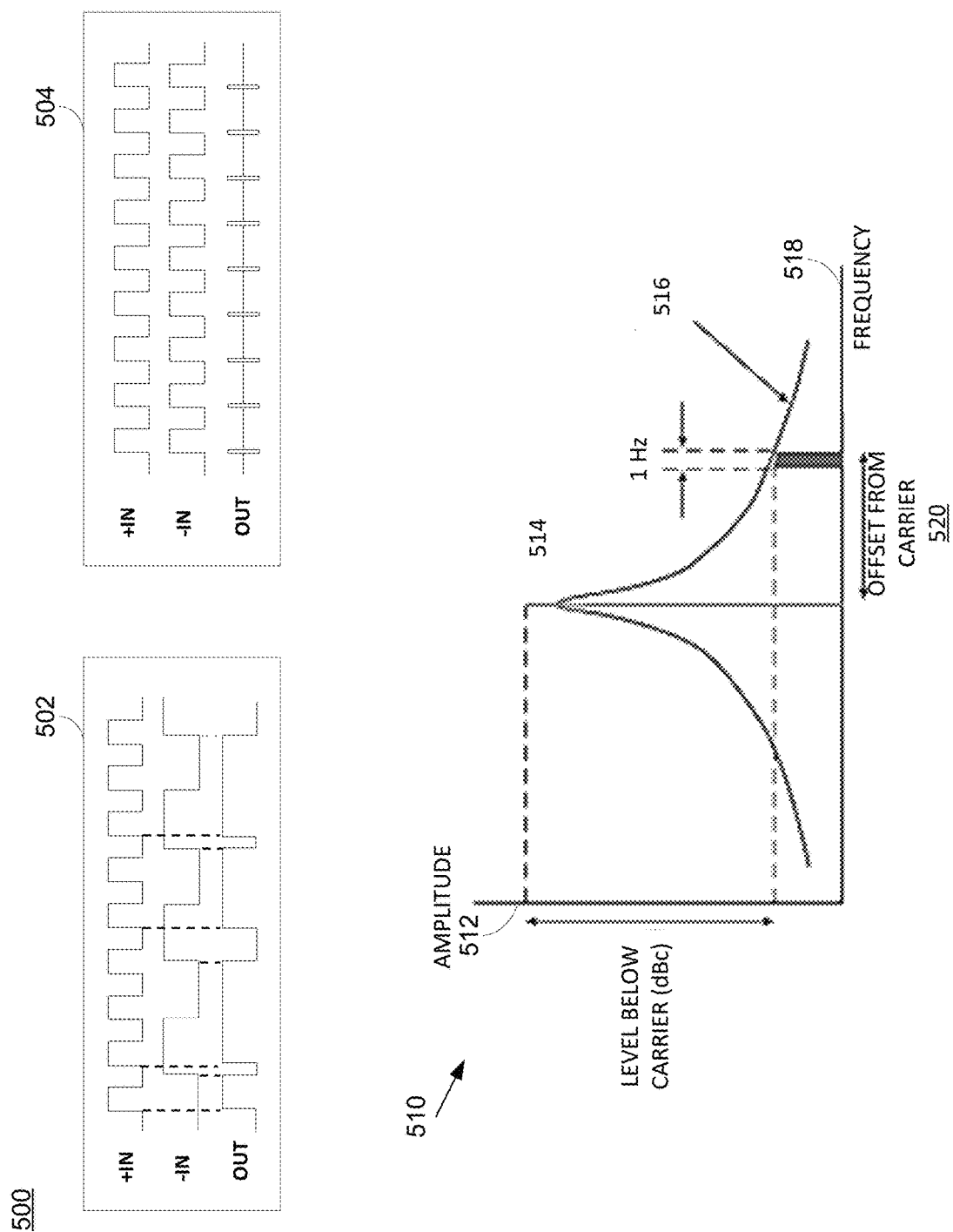
FIG. 5 illustrates diagram 500 of locking on a frequency and phase noise in a frequency synthesizer, according to an example.

FIG. 5 illustrates diagram 500 of locking on a frequency and phase noise in a frequency synthesizer, according to an example. Diagram 500 includes graph 502 illustrating how, using the circuit configuration in diagram 400, the input signal at the +IN input of D flip-flop 408 may be at a higher frequency than the reference signal at the −IN input of D flip-flop 410. A resulting charge pump output may pump the current high, increasing the tuning voltage of the VCO when integrated into the PLL low-pass filter. Thus, the frequency at the −IN input of D flip-flop 410 may increase as VCO output frequency increases, and two flip-flop inputs may eventually converge or lock at the same frequency as shown in graph 504. If the frequency of the reference signal at the −IN input of the D flip-flop 410 starts higher than the input signal frequency at the +IN input of the D flip-flop 408, the opposite may occur resulting in the eventual locking on the same frequency.

Graph 510 in diagram 500 shows how single side band phase noise 516 may be a ratio of power in a 1 Hz bandwidth to a total power in the carrier signal 514. At each offset frequency (520), points may be taken from a frequency domain plot of the signal power (across frequency axis 518 and amplitude axis 512). The phase noise 516 may be determined on a logarithmic scale.

In some examples, a wide band frequency synthesizer may utilize a wide band VCO to accommodate the wide frequency range of the synthesizer. The phase noise may be related to the frequency range and a divide ratio in the frequency divider component of the PLL. If the frequency is high and the divide ratio is large, phase noise may be high. Thus, to reduce the phase noise for high frequencies, the divide ratio may need to be reduced. Wide band VCOs may be more sensitive to tuning voltage changes compared to narrow band VCOs. Thus, frequency stability may be provided for stable performance across the frequency range. Furthermore, to be able to sweep across the frequency range rapidly, the frequency synthesizer's performance may be based on the frequency resolution.

Figure 6A:
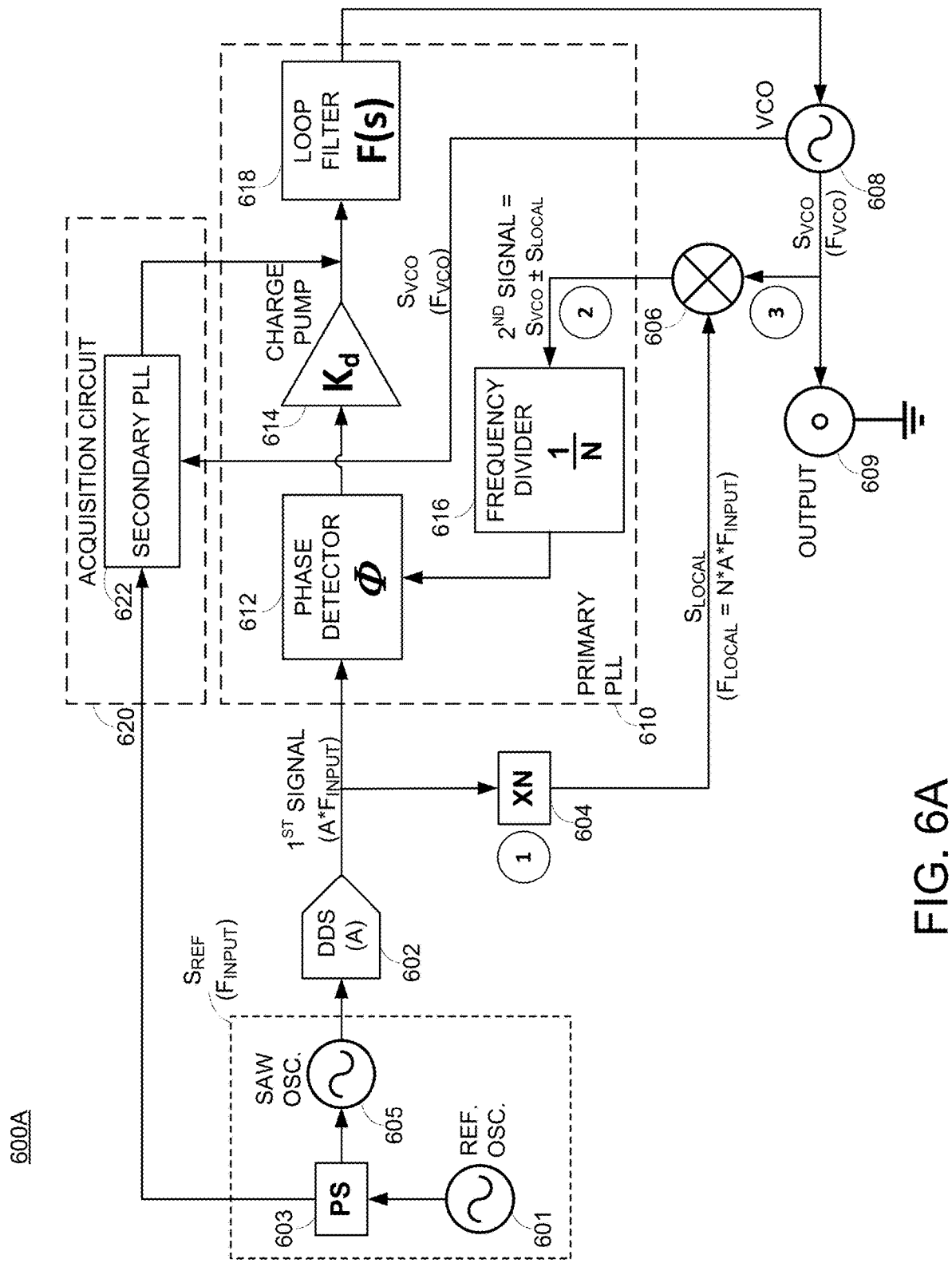
FIG. 6A illustrates diagram 600A of various received and generated signals on a diagram of a dual-structure frequency synthesizer including an acquisition circuit, according to an example.

FIG. 6A illustrates diagram 600A of various received and generated signals on a diagram of a dual-structure frequency synthesizer including an acquisition circuit, according to an example. The dual-structure frequency synthesizer may be used for any of the frequency synthesizers discussed above. Diagram 600A shows the frequency synthesizer of FIG. 2A with components of interest including DDS 602, multiplier 604, mixer 606, VCO 608, output 609, primary PLL 610, and acquisition circuit 620. The acquisition circuit 620 may include a secondary PLL 622, while the primary PLL 610 may include phase detector 612, charge [ump 614, frequency divider 616, and loop filter 618.

In an operation, reference signal $S_{REF}$ with input frequency $F_{INPUT}$ may be provided to DDS 602 by a reference signal circuit including a reference oscillator 601, a PS 603, and a saw oscillator 605 (coupled in series). The DDS 602 may provide a first signal with first frequency $A*F_{INPUT}$ (DDS 602 multiplication factor A) to the phase detector 612 and the multiplier 604. The multiplier 604 may multiply the first frequency with a factor of N providing a local signal $S_{LOCAL}$ with local frequency ($F_{LOCAL}=N*A*F_{INPUT}$) to the mixer 606. The mixer 606 may also receive the VCO signal $S_{VCO}$ with VCO frequency $F_{VCO}$ and mix $S_{LOCAL}$. An output of the mixer 606, a second signal with a second frequency $S_{VCO}\pm S_{LOCAL}$ may be provided to the frequency divider 616. The frequency divider 616 may need a lower divide ratio due to the frequency of the second signal $S_{VCO}\pm S_{LOCAL}$ being substantially lower than $S_{VCO}$. The acquisition circuit 620 may receive $S_{REF}$ and $S_{VCO}$ directly.

Figure 6B:
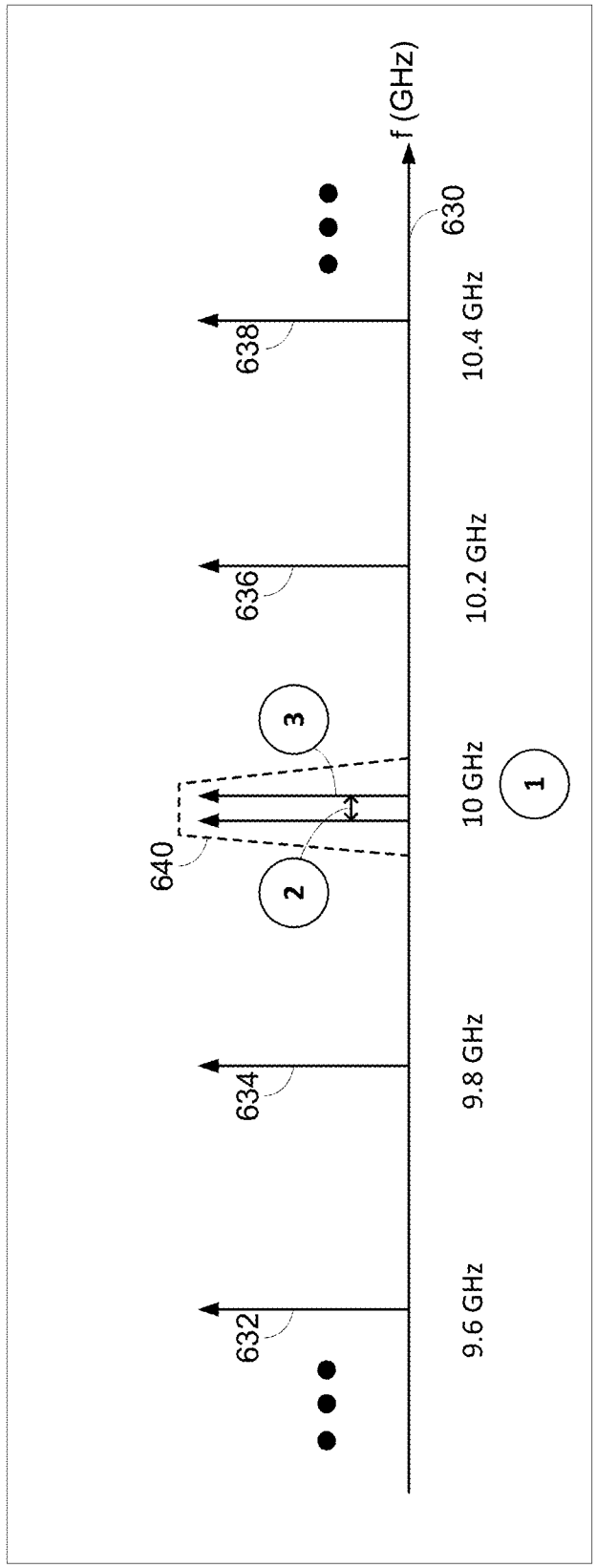
FIG. 6B illustrates diagram 600B of frequency and phase comparison range in a spectrum of generated frequencies, according to an example.

FIG. 6B illustrates diagram 600B of frequency and phase comparison range in a spectrum of generated frequencies, according to an example. Diagram 600B shows frequency and phase comparison range in a spectrum of generated frequencies 632 (9.6 GHz), 634 (9.8 GHz), 636 (10.2 GHz), and 638 (10.4 GHz) across the frequency axis 630. The intermediate frequency (IF) (2) is the difference between the VCO frequency $F_{VCO}$ (3) and the local frequency $F_{LOCAL}$ (1). In the numerical example above, the intermediate frequency is 100 MHz ($S_{VCO}\pm S_{LOCAL}$ where $S_{VCO}$ is 10.1 GHz and $S_{LOCAL}$ is 10 GHz). The DDS 602 may multiple a 10 MHz input signal by 20 and the multiplier may use a multiplication factor of 50 to arrive at 10 GHz. Phase comparison range 640 may be defined as the range of frequencies around the local and VCO frequencies as shown in the diagram. Thus, the VCO and local frequencies may be the target phase comparison frequencies.

In some examples, an acquisition circuit may be defined as an additional circuit to be implemented in a frequency synthesizer to enable an octave band VCO frequency to be moved as fast and accurately as possible within a range of a desired frequency and phase comparison among many multiples of the local frequency. If the VCO frequency is out of phase comparison range, it may be synchronized with the unwanted frequency and an error may occur. Thus, the acquisition circuit may need to be operated accurately and stably to function within the desired phase comparison range even if the external environment (e.g., temperature) changes without affecting the phase noise and a lock time. Phase noise and lock time (time it takes for the PLL to lock onto the desired frequency) may be significant performance characteristics of a frequency synthesizer. Thus, an acquisition circuit may be utilized in implementing a low phase noise, fast tracking frequency synthesizer using a wide band VCO.

While specific circuit configurations such as the arrangements of a number of components are shown in conjunction with the frequency synthesizer circuits herein, the illustrated configurations are not intended to be limiting. A dual-structure, acquisition circuit, wide band frequency synthesizer may be implemented with other configurations and component values using the principles described herein.

Figure 7:
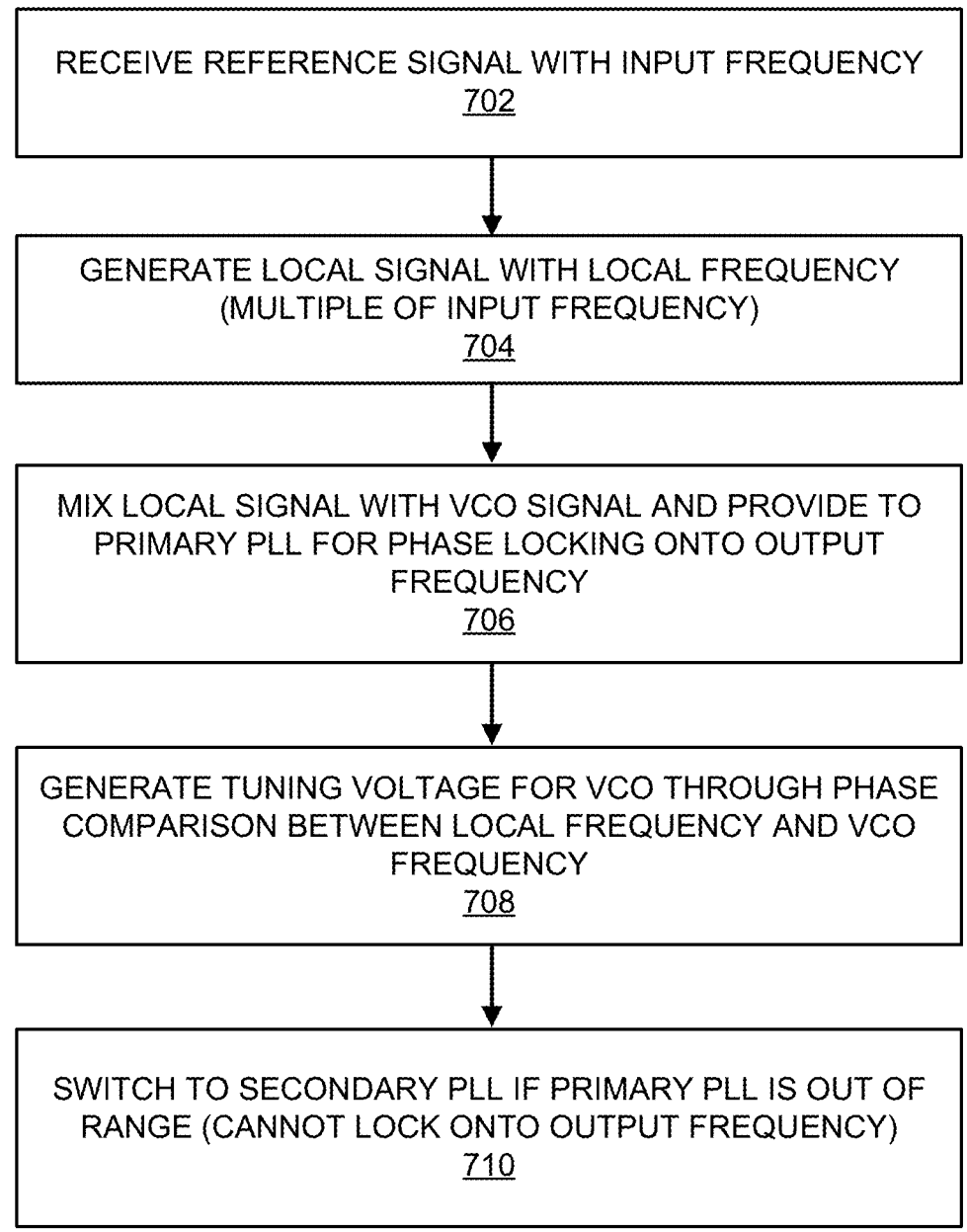
FIG. 7 illustrates a flow chart of a method for employing a dual-structure frequency synthesizer including an acquisition circuit to control a voltage-controlled oscillator (VCO) output, according to an example.

FIG. 7 illustrates a flow chart of a method for employing a dual-structure frequency synthesizer with an acquisition circuit, according to an example. The method 700 is provided by way of example, as there may be a variety of ways to carry out the method described herein. Although the method 700 is primarily described as being performed by the circuits of FIGS. 2A and 2B, the method 700 may be executed or otherwise performed by one or more processing components of another system or a combination of systems. Each block shown in FIG. 7 may further represent one or more processes, methods, or subroutines, and one or more of the blocks (e.g., the selection process) may include machine readable instructions stored on a non-transitory computer readable medium and executed by a processor or other type of processing circuit to perform one or more operations described herein.

At block 702 the frequency synthesizer may receive a reference signal (e.g., from reference oscillator 201) with an input frequency. At block 704, one or more components of the frequency synthesizer, such as the saw oscillator 202, the DDS 205, and/or the multiplier 209 may generate a local signal with a local frequency that is a multiple of the input frequency. A first multiple of the input frequency may be provided to a primary PLL 210 at a phase detector 204. The local signal derived from the first signal by another multiplication may be provided to the frequency divider 208 through a mixer 211.

At block 706, the VCO 215 of the frequency synthesizer may generate a VCO signal with a VCO frequency, which may be mixed with the local signal at the mixer 211 before being provided to the frequency divider 208. The mixing of the local signal and the VCO signal with relatively close frequencies may reduce a divide ratio of the primary PLL 210, thereby substantially reducing a phase noise at the output.

At block 708, the primary PLL 210 may perform phase comparison between the local signal and the VCO signal in the phase comparison range and generate a tuning signal for the VCO 215 to lock onto an output frequency and adjust the VCO to provide the VCO signal with the output frequency.

At block 710, a secondary PLL 232 (acquisition circuit 230) may be switched on to generate the tuning voltage for the VCO 215 based on phase comparison if the primary PLL 210 is out of range (that is, it cannot lock onto the output frequency within a predefined time period).

According to examples, a wide band frequency synthesizer acquisition circuit may include an acquisition circuit phase-locked loop (PLL) comprising a phase detector, a charge pump, and a frequency divider. The acquisition circuit PLL may receive a reference signal with an input frequency and a voltage-controlled oscillator (VCO) signal with a VCO frequency, where a VCO of the frequency synthesizer generates the VCO signal with the VCO frequency based on the tuning voltage, and the acquisition circuit PLL is activated if a primary PLL of the frequency synthesizer fails to lock on an output frequency. The acquisition circuit PLL may also generate a tuning voltage based on a phase comparison of the reference signal and the VCO signal, where the primary PLL receives a first signal with a first frequency that is a multiple of the input frequency and a second signal with a second frequency, the second signal comprising a local signal with a local frequency that is a multiple of the first frequency and the VCO signal mixed together, and generates the tuning voltage based on another phase comparison of first signal and the second signal when the acquisition circuit PLL is not activated.

According to examples, the acquisition circuit PLL may further include a loop filter comprising a buffer circuit and an inverting amplifier circuit, where an output of the buffer circuit is provided to an adjustable resistor in another loop filter of the primary PLL through a first switch, an output of the inverting amplifier circuit is provided to the VCO through a second switch, and the acquisition circuit PLL is activated via the first switch and the second switch. The phase detector may receive the reference signal, and the frequency divider is to receive the VCO signal. The acquisition circuit PLL may be activated if the primary PLL of the frequency synthesizer fails to lock on the output frequency within a predefined time period. The VCO may be a wide band VCO.

According to examples, a wide band frequency synthesizer may include a multiplier to receive a first signal with a first frequency that is a multiple of an input frequency of a reference signal provided to the frequency synthesizer; and multiply the first frequency to obtain a local signal with a local frequency; a voltage-controlled oscillator (VCO) to generate a VCO signal with a VCO frequency based on a tuning voltage; and a primary phase-locked loop (PLL) comprising a first phase detector, a first charge pump, and a first frequency divider. The primary PLL may receive the first signal and a second signal with a second frequency, the second signal comprising the local signal and the VCO signal mixed together and generate the tuning voltage based on a first phase comparison of the first signal and the second signal. The wide band frequency synthesizer may further include a secondary PLL comprising a second phase detector, a second charge pump, and a second frequency divider, which may receive the reference signal and the VCO signal; and generate the tuning voltage based on a second phase comparison of the reference signal and the VCO signal, wherein the secondary PLL is activated if the primary PLL fails to lock on an output frequency.

According to examples, the primary PLL may further include a loop filter circuit comprising an inverting amplifier circuit and a low-pass filter, where an output of the inverting amplifier circuit is provided to the low-pass filter, and an output of the low-pass filter is provided to the VCO. The inverting amplifier circuit may include an adjustable resistor, and a value of the adjustable resistor may be set by the secondary PLL when the secondary PLL is activated. The wide band frequency synthesizer may further include a saw oscillator to receive the reference signal; and a direct digital synthesizer (DDS) to receive an output of the saw oscillator and generate the second signal. The first phase detector may receive the first signal, and the first frequency divider may receive the second signal.

According to examples, the wide band frequency synthesizer may further include an amplifier coupled to an output of the VCO; and a bandpass filter coupled to an output of the amplifier. The secondary PLL may be activated if the primary PLL of the frequency synthesizer fails to lock on the output frequency within a predefined time period. The VCO may be a wide band VCO.

According to examples, a method for wide band frequency synthesis may include receiving a reference signal with an input frequency; generating a first signal with a first frequency that is a first multiple of the input frequency; providing the first signal to a primary phase-locked loop (PLL); generating a local signal with a local frequency, wherein the local frequency is a second multiple of the first frequency; generating a voltage-controlled oscillator (VCO) signal with a VCO frequency based on a tuning voltage; generating a second signal comprising the local signal and the VCO signal mixed together; providing the second signal to the primary PLL; performing a first phase comparison at the primary PLL between the firsts signal and the second signal; generating the tuning voltage based, at least in part, on the first phase comparison; and switching generation of the tuning voltage to a secondary PLL if the primary PLL fails to lock onto an output frequency.

According to examples, generating the local signal with the local frequency may include generating the first signal at a direct digital synthesizer (DDS); and providing the first signal to a phase detector o the primary PLL. Switching a generation of the tuning voltage to the secondary PLL may include receiving the reference signal and the VCO signal at the secondary PLL; performing a second phase comparison between the reference signal and the VCO signal; generating the tuning voltage based, at least in part, on the second phase comparison; and providing the tuning voltage to an output of the primary PLL.

According to examples, the primary PLL may include an inverting amplifier circuit with an adjustable resistor, and the method may also include setting a value of the adjustable resistor by the secondary PLL when the secondary PLL is activated. The method may further include determining that the primary PLL failed to lock onto the output frequency if the output frequency is outside a phase comparison frequency range. The VCO may be a wide band VCO.

While examples described herein are directed to configurations as shown, it should be appreciated that any of the components described or mentioned herein may be altered, changed, replaced, or modified, in size, shape, and numbers, or material, depending on application or use case, and adjusted for desired resolution or optimal measurement results.

It should be appreciated that the apparatuses, systems, and methods described herein may minimize, reduce, and/or eliminate phase noise and maximize, increase a tracking speed, and thereby facilitate more reliable and accurate RF measurements, specifically for wide band input signals. It should also be appreciated that the apparatuses, systems, and methods, as described herein, may also include, or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the backend to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the optical measurements, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. A wide band frequency synthesizer acquisition circuit, comprising:
    an acquisition circuit phase-locked loop (PLL) comprising a phase detector, a charge pump, and a frequency divider, wherein the acquisition circuit PLL is to:
        receive a reference signal with an input frequency and a voltage-controlled oscillator (VCO) signal with a VCO frequency, wherein
            a VCO of the frequency synthesizer generates the VCO signal with the VCO frequency based on a tuning voltage, and
            the acquisition circuit PLL is activated if a primary PLL of the frequency synthesizer fails to lock on an output frequency, and
        generate the tuning voltage based on a phase comparison of the reference signal and the VCO signal, wherein
            the primary PLL receives a first signal with a first frequency that is a multiple of the input frequency and a second signal with a second frequency, the second signal comprising a local signal with a local frequency that is a multiple of the first frequency and the VCO signal mixed together, and
            generates the tuning voltage based on another phase comparison of first signal and the second signal when the acquisition circuit PLL is not activated.

2. The wide band frequency synthesizer acquisition circuit of claim 1, wherein the acquisition circuit PLL further comprises:
    a loop filter comprising a buffer circuit and an inverting amplifier circuit, wherein:
        an output of the buffer circuit is provided to an adjustable resistor in another loop filter of the primary PLL through a first switch,
        an output of the inverting amplifier circuit is provided to the VCO through a second switch, and
        the acquisition circuit PLL is activated via the first switch and the second switch.

3. The wide band frequency synthesizer acquisition circuit of claim 1, wherein the phase detector is to receive the reference signal, and the frequency divider is to receive the VCO signal.

4. The wide band frequency synthesizer acquisition circuit of claim 1, wherein the second frequency is generated by a direct digital synthesizer (DDS) as a multiple of the first frequency.

5. The wide band frequency synthesizer acquisition circuit of claim 1, wherein the acquisition circuit PLL is activated if the primary PLL of the frequency synthesizer fails to lock on the output frequency within a predefined time period.

6. The wide band frequency synthesizer acquisition circuit of claim 1, wherein the VCO is a wide band VCO.

7. A wide band frequency synthesizer, comprising:
    a multiplier to:
        receive a first signal with a first frequency that is a multiple of an input frequency of a reference signal provided to the frequency synthesizer; and
        multiply the first frequency to obtain a local signal with a local frequency;
    a voltage-controlled oscillator (VCO) to generate a VCO signal with a VCO frequency based on a tuning voltage;
    a primary phase-locked loop (PLL) comprising a first phase detector, a first charge pump, and a first frequency divider, the primary PLL to:
        receive the first signal and a second signal with a second frequency, the second signal comprising the local signal and the VCO signal mixed together; and
        generate the tuning voltage based on a first phase comparison of the first signal and the second signal; and
    a secondary PLL comprising a second phase detector, a second charge pump, and a second frequency divider, the secondary PLL to:
        receive the reference signal and the VCO signal; and
        generate the tuning voltage based on a second phase comparison of the reference signal and the VCO signal, wherein the secondary PLL is activated if the primary PLL fails to lock on an output frequency.

8. The wide band frequency synthesizer of claim 7, wherein the primary PLL further comprises:

a loop filter circuit comprising an inverting amplifier circuit and a low-pass filter, wherein:
an output of the inverting amplifier circuit is provided to the low-pass filter, and
an output of the low-pass filter is provided to the VCO.

9. The wide band frequency synthesizer of claim 8, wherein:
the inverting amplifier circuit comprises an adjustable resistor, and
a value of the adjustable resistor is set by the secondary PLL when the secondary PLL is activated.

10. The wide band frequency synthesizer of claim 7, further comprising:
a saw oscillator to receive the reference signal; and
a direct digital synthesizer (DDS) to receive an output of the saw oscillator and generate the second signal.

11. The wide band frequency synthesizer of claim 10, wherein:
the first phase detector is to receive the first signal, and
the first frequency divider is to receive the second signal.

12. The wide band frequency synthesizer of claim 7, further comprising:
an amplifier coupled to an output of the VCO; and
a bandpass filter coupled to an output of the amplifier.

13. The wide band frequency synthesizer of claim 7, wherein the secondary PLL is activated if the primary PLL of the frequency synthesizer fails to lock on the output frequency within a predefined time period.

14. The wide band frequency synthesizer of claim 7, wherein the VCO is a wide band VCO.

15. A method for wide band frequency synthesis, comprising:
receiving a reference signal with an input frequency;
generating a first signal with a first frequency that is a first multiple of the input frequency;
providing the first signal to a primary phase-locked loop (PLL);
generating a local signal with a local frequency, wherein the local frequency is a second multiple of the first frequency;
generating a voltage-controlled oscillator (VCO) signal with a VCO frequency based on a tuning voltage;
generating a second signal comprising the local signal and the VCO signal mixed together;
providing the second signal to the primary PLL;
performing a first phase comparison at the primary PLL between the firsts signal and the second signal;
generating the tuning voltage based, at least in part, on the first phase comparison; and
switching generation of the tuning voltage to a secondary PLL if the primary PLL fails to lock onto an output frequency.

16. The method of claim 15, wherein generating the local signal with the local frequency comprises:
generating the first signal at a direct digital synthesizer (DDS);
providing the first signal to a phase detector o the primary PLL; and
multiplying the first signal at a multiplier.

17. The method of claim 15, wherein switching a generation of the tuning voltage to the secondary PLL comprises:
receiving the reference signal and the VCO signal at the secondary PLL;
performing a second phase comparison between the reference signal and the VCO signal;
generating the tuning voltage based, at least in part, on the second phase comparison; and
providing the tuning voltage to an output of the primary PLL.

18. The method of claim 15, wherein the primary PLL comprises an inverting amplifier circuit with an adjustable resistor, and the method further comprises:
setting a value of the adjustable resistor by the secondary PLL when the secondary PLL is activated.

19. The method of claim 15, further comprising:
determining that the primary PLL failed to lock onto the output frequency if the output frequency is outside a phase comparison frequency range.

20. The method of claim 15, wherein the VCO is a wide band VCO.

* * * * *